United States Patent
Turner et al.

(10) Patent No.: US 6,688,375 B1
(45) Date of Patent: Feb. 10, 2004

(54) VACUUM PROCESSING SYSTEM HAVING IMPROVED SUBSTRATE HEATING AND COOLING

(75) Inventors: Norman L. Turner, Mountain View, CA (US); John M. White, Hayward, CA (US); Alan D'Entremont, Sunol, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/950,277

(22) Filed: Oct. 14, 1997

(51) Int. Cl.[7] ........................... F25B 29/00; C23C 16/00
(52) U.S. Cl. .................. 165/48.1; 165/61; 165/80.4; 165/80.5; 165/64; 118/719; 118/725; 118/724; 156/345; 414/217; 204/298.25; 204/298.35
(58) Field of Search .................. 118/719, 725, 118/724; 156/345; 414/217; 432/5; 165/58, 48.1, 64, 80.4, 80.5, 80.1, 61; 204/298.25, 298.35

(56) References Cited

U.S. PATENT DOCUMENTS

| | | | | |
|---|---|---|---|---|
| 2,412,774 A | * | 12/1946 | Hoffman | 165/58 |
| 2,853,205 A | * | 9/1958 | Boyd | 165/58 |
| 3,808,401 A | * | 4/1974 | Wright et al. | 165/58 |
| 4,027,727 A | * | 6/1977 | Pullens | 165/58 |
| 4,775,281 A | | 10/1988 | Prentakis | 414/416 |
| 4,846,102 A | | 7/1989 | Ozias | 118/730 |
| 4,857,689 A | | 8/1989 | Lee | 219/10.71 |
| 4,870,923 A | | 10/1989 | Sugimoto | 118/715 |
| 4,913,929 A | | 4/1990 | Moslehi et al. | 427/39 |
| 4,951,601 A | | 8/1990 | Maydan et al. | 118/719 |
| 4,989,543 A | | 2/1991 | Schmitt | 118/723 |
| 5,001,327 A | | 3/1991 | Hirasawa et al. | 219/411 |
| 5,015,177 A | * | 5/1991 | Iwata | 432/5 |
| 5,060,354 A | | 10/1991 | Chizinsky | 29/25.02 |
| 5,227,708 A | | 7/1993 | Lowrance | 318/640 |
| 5,252,807 A | | 10/1993 | Chizinsky | 219/390 |
| 5,254,170 A | * | 10/1993 | Devilbiss et al. | 118/719 |
| 5,259,881 A | * | 11/1993 | Edwards et al. | 118/719 |
| 5,259,883 A | | 11/1993 | Yamabe et al. | 118/725 |
| 5,275,709 A | * | 1/1994 | Anderle et al. | 118/719 |
| 5,288,379 A | | 2/1994 | Namiki et al. | 204/192.12 |
| 5,355,066 A | | 10/1994 | Lowrance | 318/640 |
| 5,447,409 A | | 9/1995 | Grunes et al. | 414/744.6 |
| 5,469,035 A | | 11/1995 | Lowrance | 318/568.1 |
| 5,470,784 A | | 11/1995 | Coleman | 437/101 |
| 5,474,410 A | | 12/1995 | Ozawa et al. | 414/217 |
| 5,512,320 A | | 4/1996 | Turner et al. | 427/255 |
| 5,607,009 A | | 3/1997 | Turner et al. | 165/48.1 |
| 5,609,689 A | * | 3/1997 | Kato et al. | 118/719 |
| 5,620,578 A | * | 4/1997 | Hurwitt | 118/719 |
| 5,716,207 A | * | 2/1998 | Mishina et al. | 432/5 |
| 5,769,952 A | | 6/1998 | Komino et al. | 118/733 |
| 5,855,681 A | * | 1/1999 | Maydan et al. | 118/719 |
| 5,882,413 A | * | 3/1999 | Beaulieu et al. | 118/719 |

FOREIGN PATENT DOCUMENTS

| | | |
|---|---|---|
| DE | 3941110 | 12/1989 |
| JP | 63-141342 | 4/1986 |
| JP | HEI 3(1991)-136345 | 6/1991 |

* cited by examiner

*Primary Examiner*—John K. Ford
(74) *Attorney, Agent, or Firm*—Charles S. Guenzer

(57) ABSTRACT

The invention is directed a vacuum processing system having improved substrate heating and cooling facilities. An evacuable chamber of the system includes a first section in which a temperature of a substrate to be processed may be increased and a second section in which the temperature of a processed substrate may be decreased. A barrier may be provided to thermally isolate the first and second sections from each other.

16 Claims, 10 Drawing Sheets

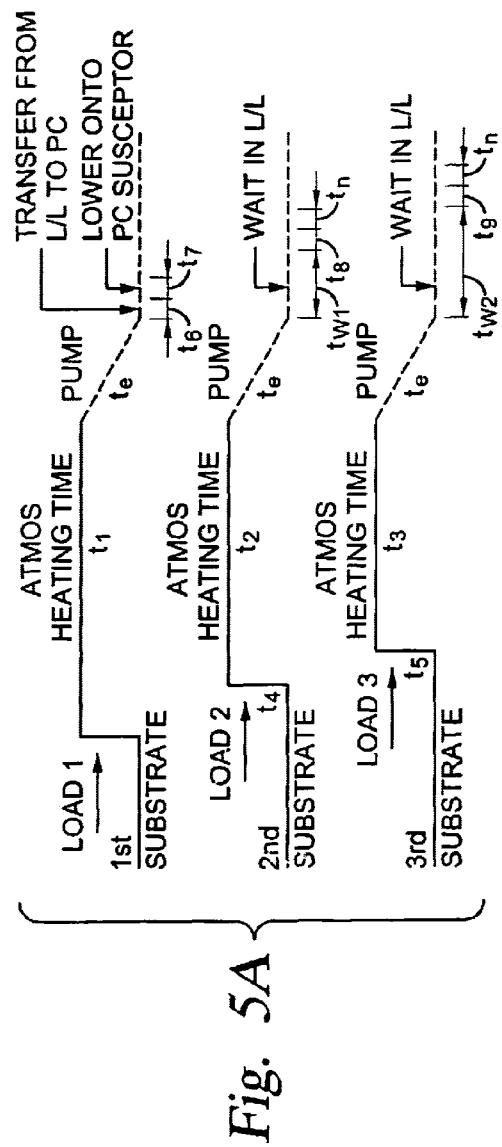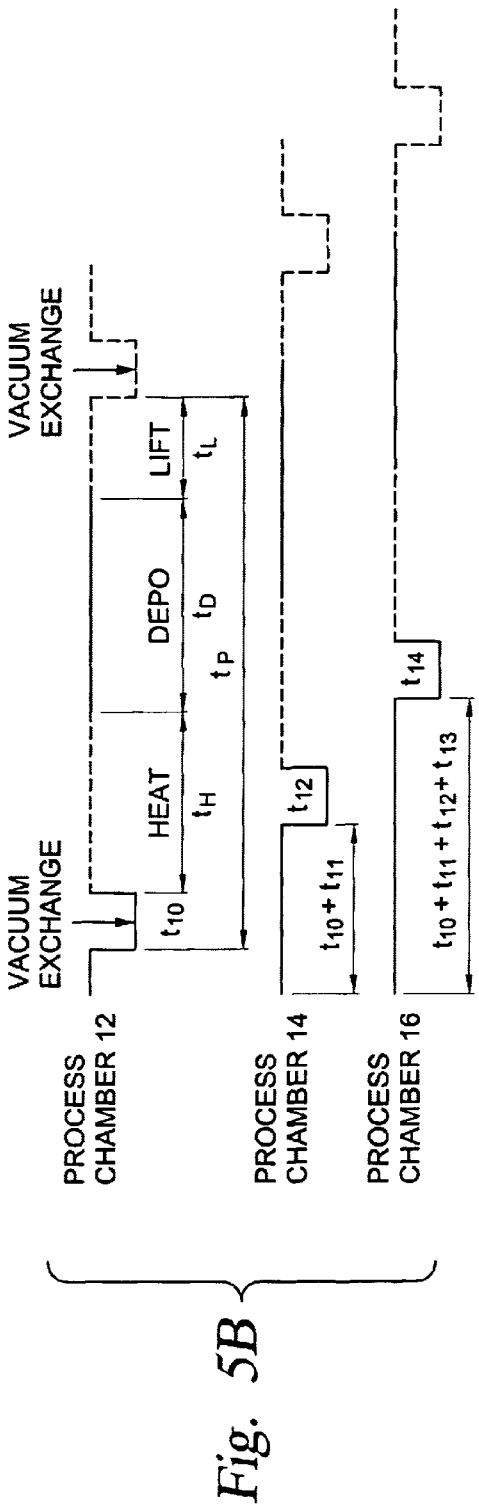
Fig. 5A
Fig. 5B

VACUUM PROCESSING SYSTEM HAVING IMPROVED SUBSTRATE HEATING AND COOLING

This invention relates to the deposition of thin films onto substrates in single substrate processing chambers, and more particularly, to a vacuum processing system that combines single substrate processing chambers with load lock heating and cooling chambers.

BACKGROUND OF THE INVENTION

Liquid crystal cells for active-matrix liquid crystal displays (AMLCDs) may comprise two glass substrates or plates between which is sandwiched a layer of liquid crystal material. A thin electrically-conductive film may be formed on the inside face of each plate. A source of power can be connected to the conductive films for changing the orientation of the liquid crystal molecules of the liquid crystal material. Up to 1,000,000 or more different areas of the cells may need to be separately addressed. These different areas are called pixels, and they may be addressed by thin film transistors (TFTs).

A TFT comprises a patterned metal gate over which is deposited a gate dielectric layer and a conductive layer, such as amorphous silicon. Subsequently applied layers, such as doped amorphous silicon, etch stopper silicon nitride, silicon oxide, metal contact layers and the like, may also be deposited over the amorphous silicon thin film. These films may be deposited, for example, by chemical vapor deposition (CVD) or plasma-enhanced chemical vapor deposition (PECVD).

In the semiconductor and flat-panel display industries, as substrates have become larger, permitting a greater number of devices to be formed on a substrate, single substrate processing has largely replaced batch processing of substrates. Single substrate processing permits greater control of the process and allows smaller processing chambers to be used. Additionally, if a problem arises during processing, only a single substrate, rather than a whole batch of substrates, is damaged or lost.

To improve the productivity of a single substrate vacuum processing system, a vacuum processing system has been used that includes a transfer chamber and multiple processing chambers, so that multiple step processes can be performed in different chambers on a single substrate in a vacuum environment. Such a system is shown in U.S. Pat. No. 4,951,601, assigned to applied materials, Inc. and which is hereby incorporated by reference. This system includes a central transfer chamber surrounded by and connected to various process chambers. A robot in the transfer chamber transfers the substrates from one process chamber to another. A vacuum load lock is provided to eliminate the need for evacuating the process chambers prior to each processing step, thereby increasing the throughput of the system.

Glass is a brittle dielectric material that requires slow heating and cooling to avoid cracking or stressing over process temperature ranges which may extend from about room temperature to 450 degrees Centigrade (° C.). A significant difference in thermal expansion may occur when heating a large substrate, for example, one which is 550×650 to 800×1,000 millimeters (mm). This problem may arise due to the failure of the substrate heater elements to provide a uniform temperature across the large dimension of the substrate. Further, the perimeter of the substrate can have more heat loss than its central area, thus lower temperatures than the central area. These temperature nonuniformities lead to thermal stresses. In smaller substrates, for example, substrates 360×450 mm, the problem is less pronounced but nevertheless evident.

TFTs, as noted, may be fabricated using a CVD or PECVD process. These film deposition processes require relatively high temperatures, on the order of 300 to 450° C., and only take seconds to perform, for example, 60 to 240 seconds. The glass substrates useful for AMLCDs are typically quite large, for example, 550×650 to 800×1000 mm. Thus, it may take several minutes to heat a substrate to the processing temperature and then to cool it back to ambient temperature, after the film deposition process has been completed. If the substrates are being individually heated and cooled, there may be a significant loss of processing time due to heating and cooling delays. Thus, film deposition of individual substrates in several process chambers may result in inefficient operation, unless the possibly long heating and cooling delay times are addressed.

A vacuum processing system having improved throughput that can process large glass substrates in a series of single substrate processing chambers and that solves the heating and cooling delay time problem is disclosed in U.S. Pat. No. 5,512,320, assigned to applied materials, Inc. and which is hereby incorporated by reference. This cluster system comprises a plurality of single substrate processing chambers, a batch-type heating chamber, and batch-type cooling chambers. The chambers are connected to a central transfer chamber. A robot in the transfer chamber can move the substrates among the various chambers in any preselected order. The batch heating and cooling chambers and the single substrate processing chambers provide continuous and rapid substrate processing while allowing adequate time for heating and cooling of glass substrates.

SUMMARY OF THE INVENTION

The invention relates to an evacuable chamber of a vacuum processing system in which a substrate to be processed may be heated and a processed substrate cooled. The chamber includes a first section in which the temperature of a substrate to be processed may be increased and a second section in which the temperature of a processed substrate may be decreased. At least one substrate support platform is provided in each of the first and second sections. A barrier may be used to thermally isolate the first and second sections from each other.

The evacuable chamber may function as a load lock chamber to transfer a plurality of substrates to and from a vacuum processing chamber. The load lock chamber may include thermally conductive shelves in the first and second sections. The shelves may include supports to provide a gap between the shelves and the substrates supported thereon.

The invention, in another aspect, relates to a cassette adapted to be positioned in an evacuable load lock chamber. The cassette includes a first section in which a substrate to be processed may be heated and a second section in which a processed substrate may be cooled. Heaters are incorporated into sidewalls of the cassette in the first section, and cooling passageways are incorporated into sidewalls of the cassette in the second section.

The invention, in another aspect, features a method wherein a first substrate is loaded into a heating section of a first vacuum load lock chamber and heated to an elevated temperature. The heated substrate is transferred to a selected process chamber. A second substrate is loaded into a heating section of a second vacuum load lock chamber and also heated to an elevated temperature. After the first substrate has been processed, it is transferred from the selected process chamber to a cooling section of the second load lock chamber. The heated substrate in the heating section of the second load lock chamber is then transferred to the process chamber from which the first substrate was removed. The first substrate is subsequently unloaded from the cooling section of the second load lock chamber.

The invention, in another aspect, also includes loading a substrate onto a platform in a first load lock chamber, increasing the temperature of the platform and positioning the substrate adjacent to another area of increased temperature in the first load lock chamber to heat the substrate. The heated substrate is transferred from the first load lock chamber to a process chamber. After the substrate has been processed, it is transferred to a second load lock chamber and positioned on a platform. The temperature of the platform in the second load lock chamber is decreased and the substrate is positioned adjacent to another area of decreased temperature in the second load lock chamber to cool the substrate.

The method, alternatively, may involve positioning a substrate on a heated platform in the first load lock chamber, processing the substrate and then cooling it by placing it on a cooled platform in the second load lock chamber.

The number of process chambers may equal the number of substrates in the first load lock chamber. A substrate may be inserted into or removed from the first and second load lock chambers on an ambient side thereof in a direction generally perpendicular to a short dimension of the substrate. The substrate may be inserted into and removed from the first and second load lock chambers, and the process chamber on a vacuum side thereof in a direction generally perpendicular to a long dimension of the substrate.

Advantages of the invention may include one or more of the following. The system of the present invention provides an economic and advantageous way of forming high quality thin films on substrates in an efficient and economic manner. The system incorporates a batch-type heating and cooling cassette in a single load lock chamber. The system may also include single substrate heating and cooling chambers providing rapid substrate heating and cooling. The system has a relatively small footprint, and is relatively inexpensive to manufacture and operate.

Other advantages and features of the present invention will become apparent from the following description, including the drawings and claims.

BRIEF DESCRIPTION OF THE DRAWINGS

FIG. 5A is a timing analysis illustrating the substrate preheating cycle in a load lock chamber.

FIG. 5B is a timing analysis illustrating the process cycle in the process chambers.

In the following description of the invention, the same structures illustrated in different figures are referred to with the same reference numerals.

DETAILED DESCRIPTION

The present invention is directed to a method and apparatus for depositing one or more films onto a substrate. The system of the present invention is described with respect to PECVD processing chambers. However, it is also applicable to other sorts of processing chambers, such as CVD processing chambers. Certain of the details described are specific to the implementation described and may be changed as required by processing conditions or other parameters.

Figure 1:
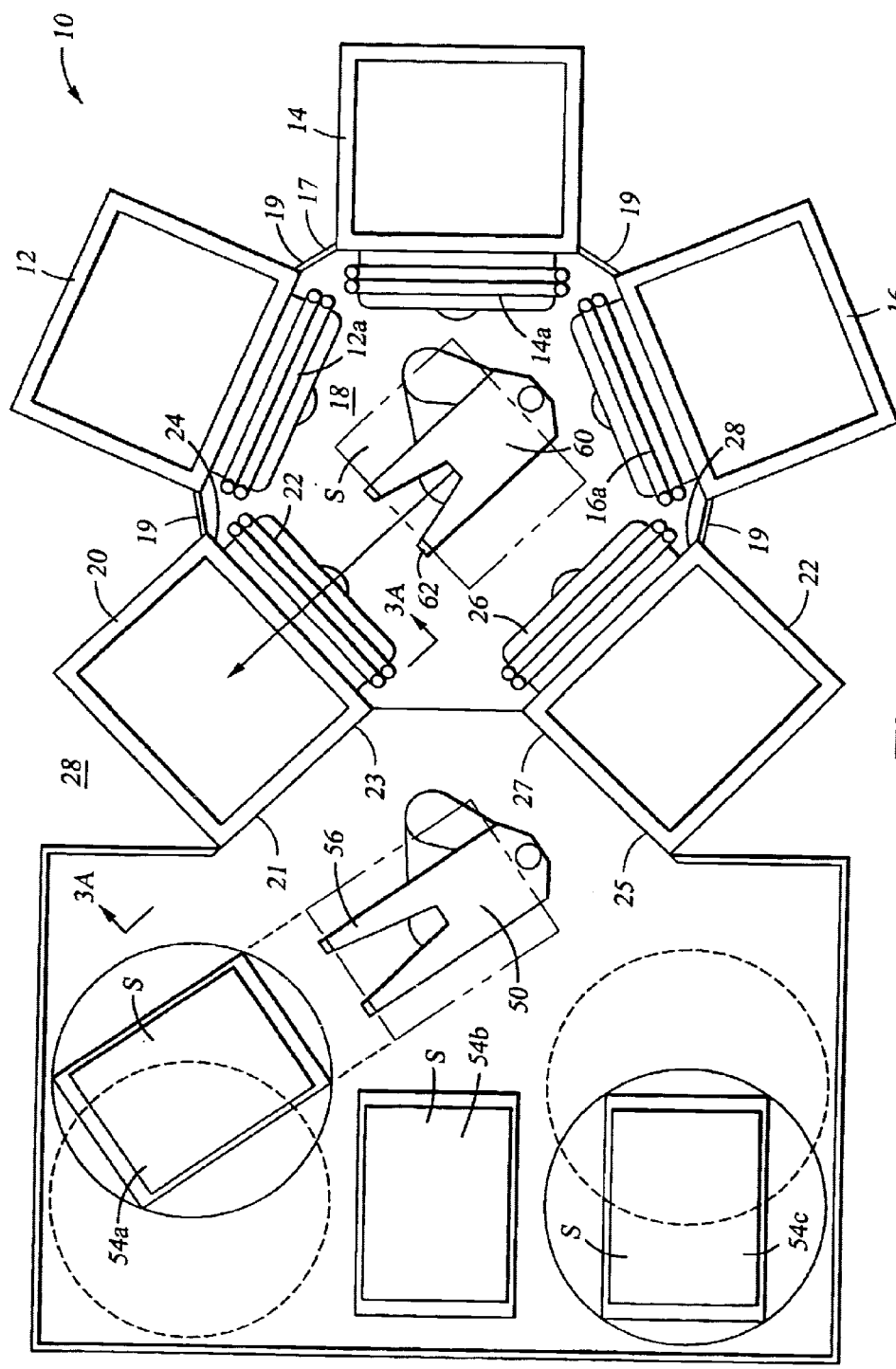
FIG. 1 is a schematic plan view of the processing system of the present invention for depositing a film onto a substrate.

The vacuum processing system 10 of the present invention, shown in FIG. 1, is designed for use in the production of large liquid crystal displays, such as AML-CDs. It is a modular system with multiple vacuum deposition process chambers (PC) 12, 14 and 16 clustered around an enclosed vacuum transfer chamber 18. The system also includes two load lock (L/L) chambers 20 and 22. The chambers 12, 14, 16, 18, 20, and 22 are selectively evacuable by one or more vacuum pumps (not shown).

The system 10 includes an enclosed housing 17 having sidewalls 19 that define central chamber 18. The individual load lock and process chambers are mounted on an associated sidewall 19 of housing 17. The process chambers can be used for depositing, for example, amorphous silicon, silicon nitrides, silicon oxides, and oxynitrate films onto substrates S.

The term "substrate" as used in this description is intended to broadly cover any object that may be processed in a process chamber. The term "substrate(s)" includes, for example, semiconductor wafers, flat-panel displays, glass plates and disks. The present invention is particularly applicable to large rectangular substrates such as glass plates having dimensions of 550×650 mm, 800×1000 mm or even larger. The system of the present invention may also be used to process smaller substrates, such as those 360×450 mm. In the remainder of this detailed description, for the particular embodiments discussed, a rectangular glass substrate is assumed. However, as noted, other substrates may also be processed in system 10. For example, square substrates may be processed in system 10.

In general, a substrate is preheated to a temperature of several hundred degrees, for example, between about 300 and 450° C., in one of two load lock chambers 20 and 22. The substrate is then transferred to and supported in one of the process chambers, where it is maintained at a process temperature. Deposition gases are injected into the process chamber so that a chemical reaction occurs to deposit a thin film onto the substrate. The thin film may be a dielectric layer (such as silicon nitride or silicon oxide), a semiconductor layer (such as amorphous silicon) or a metal layer (such as tungsten). The deposition process may be, as noted, CVD or PECVD. After the deposition process is completed, the substrate is subsequently cooled in one of the load lock chambers.

The substrates may be heated by placing them on a heated platform in a load lock chamber. Alternatively, the substrates may be loaded onto an unheated platform and the temperature of the platform increased to heat the substrates. Similarly, the substrates may be cooled by placing them on a cooled platform, or, alternatively, they may be positioned on an uncooled platform wherein the temperatures of the platform is subsequently decreased.

Figure 2:
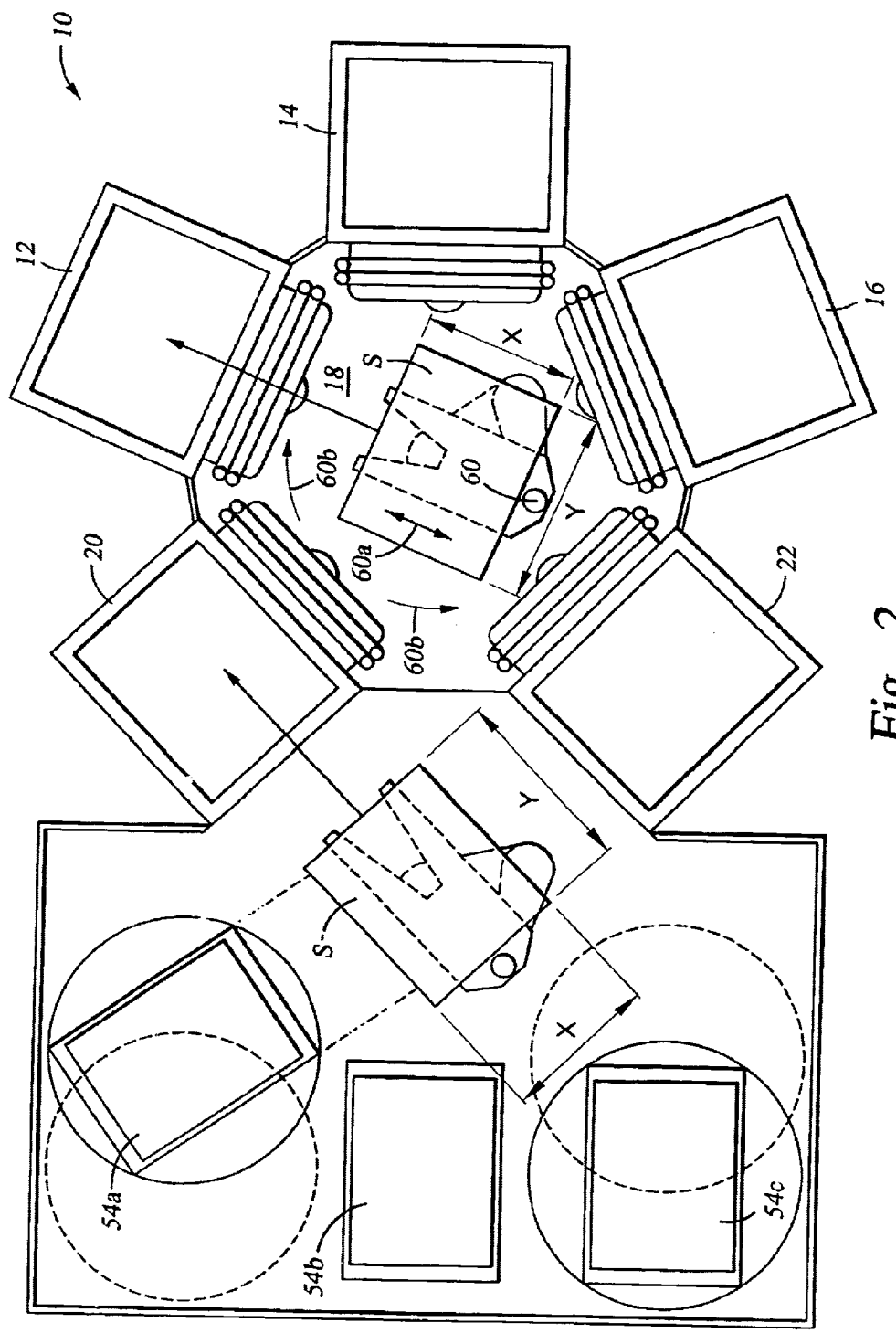
FIG. 2 is a plan view of the processing system of FIG. 1 schematically illustrating the movement of substrates in the processing system.

As shown in FIGS. 1 and 2, central transfer chamber 18 is connected to load lock chambers 20 and 22, each for transferring a substrate to be processed into central transfer chamber 18. The load lock chambers 20 and 22, as described in more detailed below, can both heat and cool the substrates. The load lock heating and cooling chamber 20 has closable openings comprising load lock doors or slit valves 21 and 21b on an outside wall 23 and an inside wall 24, respectively. The substrates can be transferred between central chamber 18 and atmosphere 28 via these doors. Similarly, load lock heating and cooling chamber 22 includes closable openings comprising load lock doors or slit valves 25 and 26 on an outside wall 27 and an inside wall 28, respectively, for transferring substrates between central chamber 18 and the atmosphere.

The process chambers 12, 14 and 16, and associated housing walls 19, also have closable openings which are similar or identical to load lock doors 21b and 26 of chambers 20 and 22, respectively. Specifically, process chambers 12, 14 and 16 include load lock doors or slit valves 12a, 14a and 16a, respectively, for sealing the process chamber access slits, thus isolating the process gases in the process chambers.

The chambers 20 and 22 may each contain a cassette 30 (see, for example, FIG. 3A) fitted with a plurality of horizontal shelves or platforms for supporting, and heating and cooling the substrates. The rate of heating or cooling of a glass substrate is determined by the total amount of convection, conduction and radiation heat transfer.

Figure 3A:
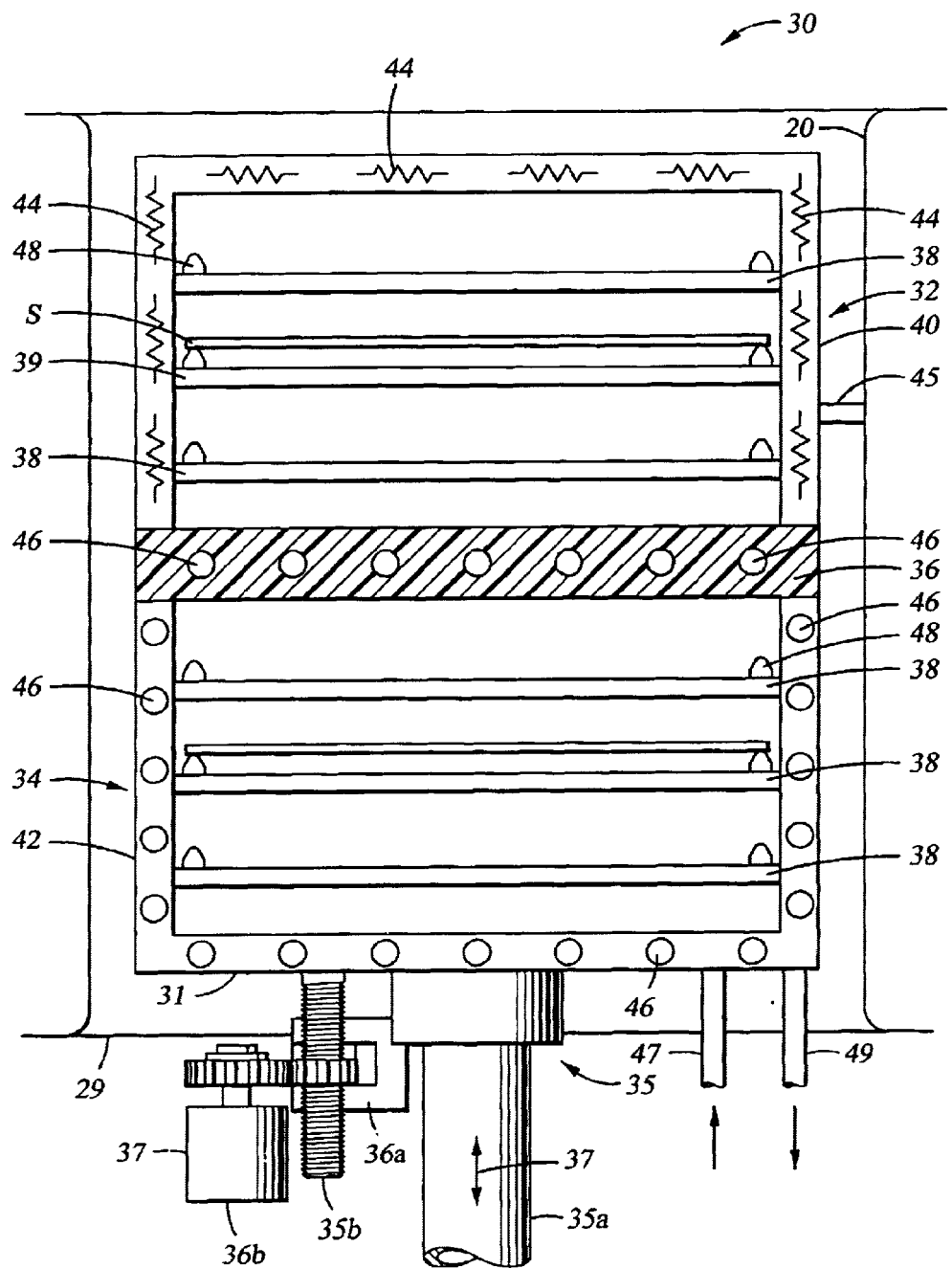
FIG. 3A is a schematic cross-sectional view of a batch-type heating and cooling chamber of the processing system of the present invention, along line 3A—3A of FIG. 1.

For the cassette embodiment of FIG. 3A, when the chamber is at atmosphere, heat is transferred to the glass principally by convection and radiation, and when the chamber is in vacuum (less than about 10 Torr), heating is principally by radiation. The rate of glass heating and cooling is considerably higher at atmosphere than at vacuum due to the transfer rate of gas convection.

As shown in FIG. 3A, cassette 30 in each chamber 20 and 22 is mounted on an elevator assembly 35 to raise and lower the cassettes incrementally the height of one shelf. The elevator assembly indexes the substrates vertically, as indicated by arrow 37, to present them for loading and unloading by robots 50 and 60, as discussed in more detail below. The elevator assembly may include one or more guide shafts 35a and a drive shaft 35b. These shafts extend downwardly through vacuum-tight seals (not shown) in the lower walls of chambers 20 and 22, for example, wall 29 of chamber 20, as shown in FIG. 3A. The elevator assembly may include a vertical indexing system comprising a lead screw 36a that is rotated by a motor-driven gear set 36b that is suitably connected to drive shaft 35b.

The cassettes 30 in each chamber 20 and 22 are constructed in a similar manner. They include a heating section 32 and a cooling section 34. In the embodiment illustrated, since there are three process chambers, each of sections 32 and 34 includes three horizontal shelves 38. A heat shield or thermal barrier 36 may be disposed between heating section 32 and cooling section 34 to substantially thermally isolate one section from the other and thereby improve the overall efficiency. The heat shield 36 can be made of a material which has a low emissivity, a low thermal conductivity, and which does not absorb a significant amount of heat by radiation. As discussed below, the heat shield may also include channels 46 for the flow of a suitable coolant therethrough.

The shelves 38 are made of a good heat conductive material, such as aluminum, copper or the like. The sidewalls 40 and 42 of the heating and cooling sections 32 and 34, respectively, are also made of a heat conductive metal, such as aluminum or copper. The shelves are in contact with the sidewalls of the heating and cooling sections so that heat may be conducted between the shelves and the sidewalls.

A channel or conduit 44 in sidewalls 40 of heating section 32 contains a resistive-type electrical heater 44, such as heating coils, connected to a source of electrical power (not shown). A conduit 45 may be provided in sidewalls 40 to contain the wiring between the electrical power source and the heating coils.

Other heating sources may be used in place of resistive-type electrical heater 44. For instance, the heating section could include one or more radiation sources, such as infrared lamps, for heating the substrates. Substrate heating could also be accomplished by flowing a heated inert gas, such as nitrogen ($N_2$), over the substrate surface.

A channel or fluid passageway 46 in sidewalls 42 of cooling section 34 provides a flow path for the circulation of a coolant, such as water or a cooling gas, through the sidewalls. Inlet and outlet coolant pipes 47 and 49, respectively, may be fitted in bottom wall 31 of cassette 30 for the circulation of a coolant through fluid passageways 46.

Similar coolant channels 46 may be located in heat shield 36 for coolant flow. This coolant circulation provides further thermal isolation between the heating and cooling sections of cassettes 30.

The substrates may be positioned on a plurality of mounts 48 which are located on or affixed to shelves 38 so that there is a gap between the substrates and the shelves. The mounts 48 may be made of a suitable material such as high temperature glass, stainless steel or quartz. The substrates are thus not in direct physical contact with the shelves, precluding direct heat transfer therebetween. The mounts 48 may also be eliminated and the substrates may be in direct physical contact with the shelves. As such, the substrates will principally be heated by conduction.

The substrates are ideally heated or cooled uniformly from both sides. The temperature of a substrate is changed, depending on which section of the cassette it is positioned in, by heat transfer from the substrate to the shelves above and below the substrate. This not only provides rapid and uniform heating or cooling but also reduces thermal stresses, preventing cracking or warping of the substrates, even when heating or cooling over a temperature range of about 400° C.

Figure 3B:
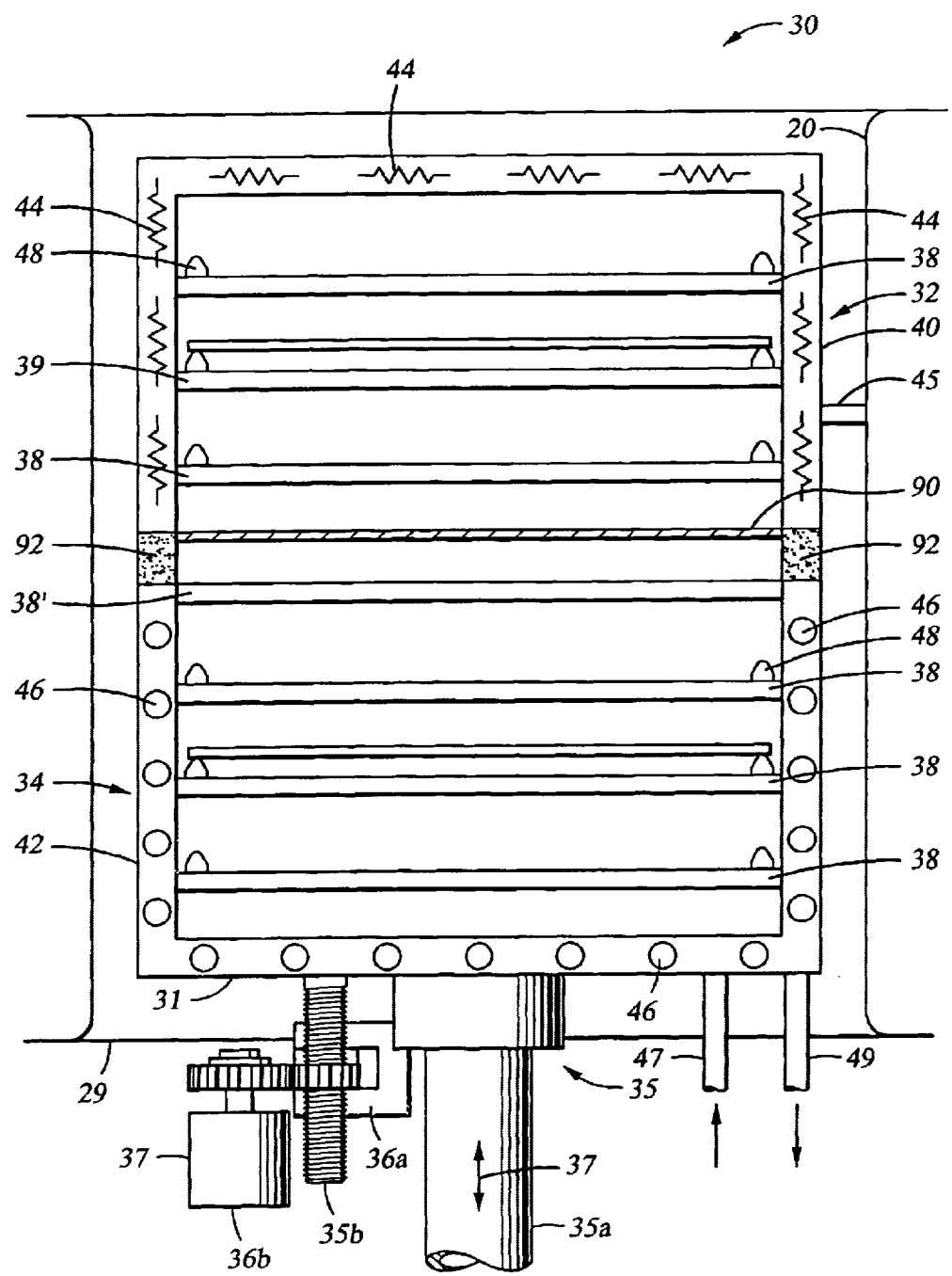
FIG. 3B is a schematic view of another configuration of a batch-type heating and cooling chamber.

FIG. 3B shows a cassette 30' in which heat shield 36 is replaced by a thermal barrier comprising a plate 90 made of a heat reflective material, such as aluminum. A number of nonconductive posts 92 are provided to further substantially thermally isolate the heating and cooling sections 32 from 34 each other. These posts may be made of a glass or ceramic material. A shelf 38', without any supports 48, may be included in this embodiment so that a substrate on shelf 38, below shelf 38' in the cooling section, may be cooled on both sides.

It may also be possible to eliminate any sort of physical thermal barrier between the heating and cooling sections. The desired temperatures within the heating and cooling sections would then be maintained, for instance, by applying appropriate power to the heating section while flowing an adequate amount of coolant through the cooling section.

Figure 3C:
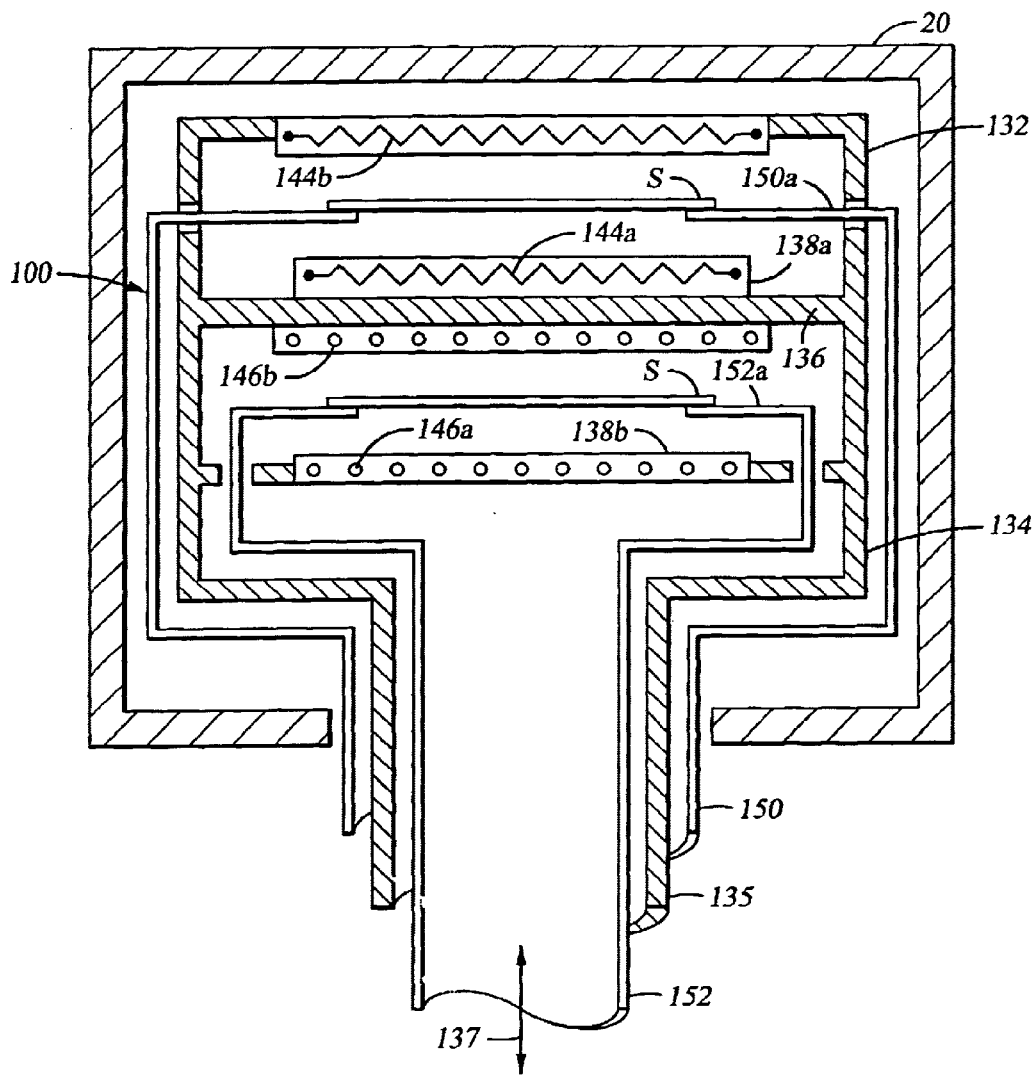
FIG. 3C is a schematic view of still another embodiment of a heating and cooling chamber.

Another embodiment of a heating and cooling chamber is shown in FIG. 3C. Here, chambers 20 and 22 each contain a respective cassette 100 mounted on an elevator assembly 135 of the type described above. The elevator assembly 135 indexes the substrates vertically, as indicated by arrow 137, to present them for loading and unloading. Cassette arrangement 100 in each chambers 20 and 22 may be constructed in a similar manner. The cassette may include a heating section 132 and a cooling section 134. In the embodiment illustrated, heating section 132 and cooling section 134 include a shelf or platform 138a and 138b, respectively, for supporting a substrate. As discussed above, an appropriate heat shield or thermal barrier 136 may be located between heating section 132 and cooling section 134. The shelf 138a may be heated by a resistive-type electrical heater 144a, such as heating coils connected to a source of electrical power. As shown, heaters 144a may be incorporated into the shelf. Another heater 144b may be located above shelf 138a on which a substrate to be processed is supported.

Additionally, the chambers 20 and 22 may be purged with an atmosphere of an inert gas such as $N_2$. The substrate mounted in cassette 100 is rapidly heated by conduction, convection and radiation. While most of the substrate heating is accomplished by the substrate being in direct contact with heated shelf 138a, upper heated shelf 144b substantially reduces heat loss through the substrate by operating at the same elevated temperature as lower shelf 138a.

A channel or fluid passageway 146a may be located in shelf 138b to provide a flow path for the circulation of a coolant. A similar coolant channel 146b may be located above shelf 138b.

The cassette arrangement 100 may also include an appropriate lifting assembly or mechanism 150 for lifting a substrate S away from shelf 138a in heating section 132 such that the substrate S is disposed substantially between heaters 144a and 144b. Similarly, cassette arrangement 100 may include a lifting assembly 152 for lifting a substrate away from shelf 138b in cooling section 134 such that the substrate is located between cooling passageways 146a and 146b. The lift mechanisms 150 and 152 include support fingers 150a and 152a for supporting the substrate S above the shelves 138a and 138b as shown in FIG. 3C, respectively. The lift mechanisms 150 and 152 facilitate the loading and unloading of substrates from the load lock chambers. They may operate independently of one another, or they may operate together. As described above, the substrates are loaded into and removed from the load lock chambers by way of slit valves on the atmospheric and vacuum sides of the chambers.

The cassette 100 is ideally suited for use with a system including a single process chamber. However, depending upon the process times, cassette 100 may be used with a system including more than one process chamber. For example, it could be used with the system of FIG. 1

Figure 3D:
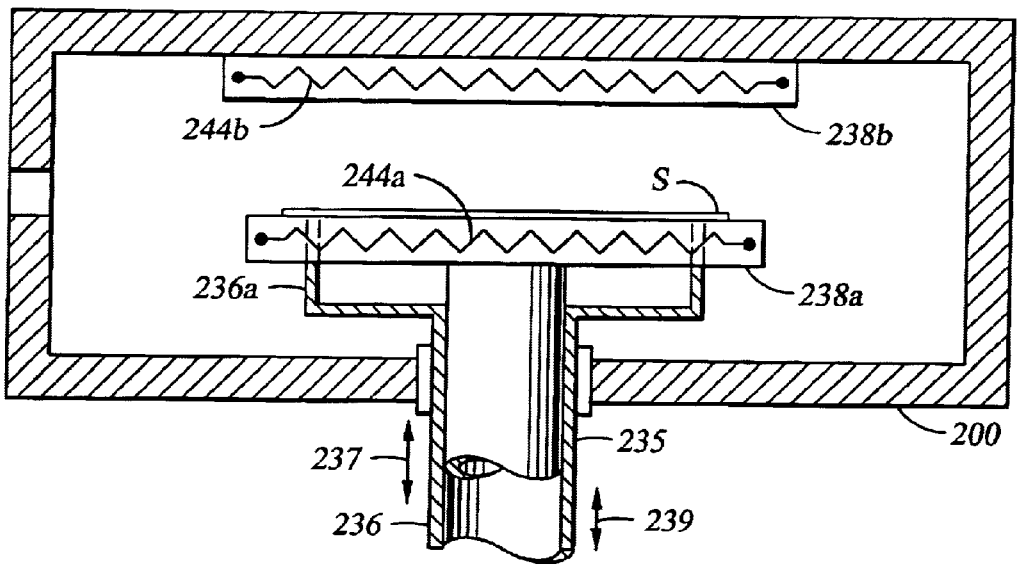
FIG. 3D is a schematic view of an embodiment of a heating chamber for a single substrate.

The processing system may alternatively include separate heating and cooling load lock chambers wherein a single substrate is first heated in one load lock chamber and then, after processing, cooled in another load lock chamber. As shown in FIG. 3D, the heating load lock chamber 200 may include a shelf or suspector 238a made of a good heat conductive material for supporting a substrate S. A resistive-type electrical heater 244a may be incorporated into the shelf for heating the substrate. An additional heater, such as resistive-type electrical heater 244b, is located above shelf 238a. Heater 244b may be incorporated into a heat-conductive shelf or suspector 238b.

Shelf 238a is mounted on an elevator assembly 235 to index the substrate vertically, as represented by arrow 237. In the load position, a robot end effector places a substrate on the lower heated 238a. The shelf 238a is then moved upwardly to a position proximate the upper heated shelf 238b. For instance, the substrate may be moved to a position about 3 mm away from the lower shelf 238b. As the substrate is being moved vertically, chamber 200 may be purged with an atmosphere of inert gas. During the course of this operation, the substrate is being rapidly heated by conduction, convection and radiation. Most of the heating is accomplished by conduction; the presence of upper heated shelf 238b greatly reduces heat loss, since the shelves 238a and 238b are operated at substantially the same elevated temperature. After being heated to the desired temperature, the substrate S is moved downwardly for unloading via a slit valve in chamber 200.

Figure 3E:
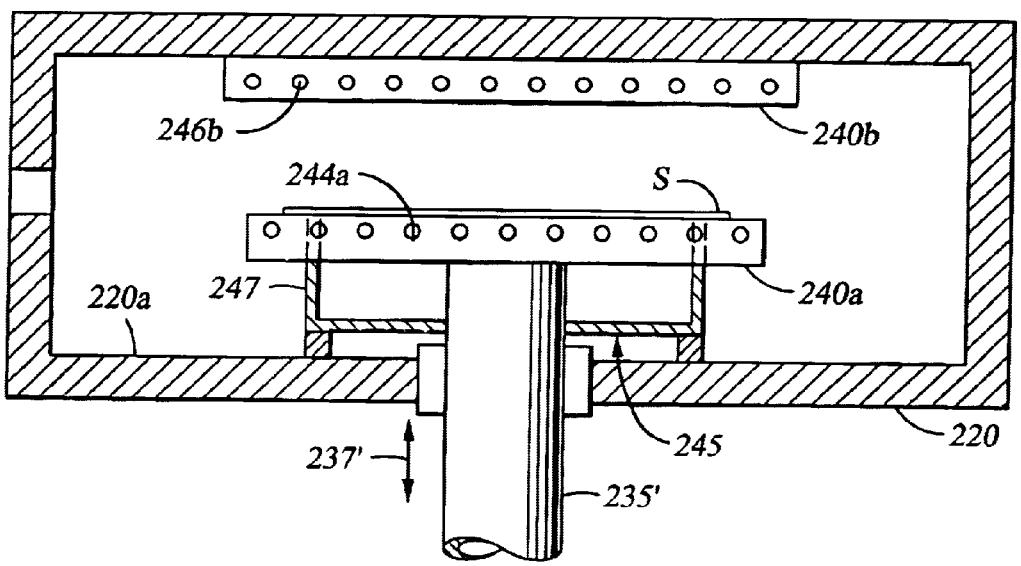
FIG. 3E is a schematic view of an embodiment of a cooling chamber for a single substrate.

As shown in FIG. 3E, a cooling load lock chamber 220 includes a lower shelf 240a, also made of a good heat conductive material, for supporting a substrate during cool down. The shelf 240a may include a fluid passageway or passageways 246a to provide a flow path for the circulation of a coolant. A similar coolant channel or channels 246b may be located above shelf 240a.

A substrate positioned on platform 240a may be moved vertically (arrow 237') by means of an elevator assembly 235'. After processing, the substrate is loaded onto shelf 240a in chamber 220 and moved into a position proximate cooling passageway 246b. As such, the substrate S is effectively cooled from both sides by means of the coolant flowing through channels 246a and 246b. After its temperature is sufficiently reduced, the substrate is moved downwardly and unloaded by way of the slit valve in the chamber wall.

Also, as shown in FIG. 3D, the load lock chamber 200 may include a lifting assembly 236 which is coaxially arranged relative to the shaft of elevator assembly 235 to move a substrate vertically relative to platform 238a as indicated by arrow 239. The lifting assembly 236 includes support members or fingers 236a which extend through suitable openings in platform 238a for supporting the substrate above the platform. The lifting assembly 236 can be operated to lift a substrate from or place a substrate on platform 238a.

As shown in FIG. 3E, the load lock chamber 220 may include a vertical-stationary lifting assembly 245 which can be used to lift a substrate from or position a substrate on platform 240a. The lifting assembly 245 includes support members or fingers 247 which extend through openings in platform 240a to engage the substrate. The support fingers 247 are affixed to the bottom inner wall 220a of chamber 220. Thus, when elevator assembly 235 is operated, for example, to move platform 240a in a downward direction, the substrate will be positioned above the platform by means of support fingers 247.

Chambers 200 and 220 may be fitted with either lifting assembly 235 or 245, as desired. A substrate may be removed from or positioned within a chamber in the position in which it rests on the lifting assembly support fingers.

As discussed, during operation of a processing system incorporating chambers 200 and 220, a substrate S may be loaded into chamber 200 by a robot end effector and positioned on fingers 236a of lifting assembly 236. The platform 238a, which may already be at an elevated temperature, is raised by means of elevator assembly 235 to engage the substrate and move it to a position proximate heater 244b. The substrate on platform 238a, which is proximate to platform 238b, is thus rapidly heated from both sides by heaters 244a and 244b.

After the substrate has been heated to the desired temperature, platform 238a is lowered and the substrate is again engaged by support fingers 236a. The lifting assembly 236 can then appropriately position the substrate for removal from chamber 200 by the robot end effector.

After substrate S has been processed, it is loaded into chamber 220 for rapid cooling. The substrate may be positioned on support fingers 247 of lifting assembly 245 by a robot end effector. The platform 240a, which may already be at a decreased temperature, is then elevated by elevator assembly 235 to engage the substrate and support it in a position proximate to pooling passage ways 246b. The substrate is thus rapidly cooled from both sides by means of the coolant in passageways 246a and 246b.

After the substrate has been cooled to the desired temperature, platform 240a is lowered to position the substrate on support fingers 247. The substrate then can be removed from chamber 220 by the robot end effector.

The substrates can be loaded into chambers 20 and 22 manually or in an automated fashion. As shown in FIG. 1, a commercially-available robot 50 mounted at a station at atmospheric conditions can retrieve a substrate S from one of three different storage cassettes 54A, 54B or 54C. These cassettes may comprise a vertically-disposed arrangement of horizontal plates or platforms for supporting the substrates. These platforms may include projections for supporting the substrates above the surface of the platform to facilitate access to the substrates by an associated blade or arm assembly 56 of robot 50. The substrates retrieved in this fashion then can be loaded one at a time, as described below, into chambers 20 and 22. The gap or spacing provided by mounts 48 of cassettes 30 also allow the robot arm assembly 56 to access the substrates in cassettes 30.

The atmospheric robot 50 and its associated blade assembly 56 can move along three different axes. Specifically, the robot blade can be extended or retracted (R movement), moved up and down in a vertical direction (Z movement), or be swept about a range of angles (θ movement). The θ movement in the embodiment illustrated is 360° or more; that is, the robot blade may be rotated 360° in either direction.

The storage cassette 54B is stationary. The storage cassettes 54A and 54C on the other hand, are capable of rotatable and translational movements as illustrated by the circles in phantom and the different positions of cassettes 54A and 54C. This facilitates access to the substrates on these cassettes by robot 50.

As mentioned, the substrates are typically rectangular in shape. For example, substrates S may measure 800 mm (the short dimension, "x")×1,000 mm (the long dimension, "y"). As illustrated by FIGS. 1 and 2, the substrates are located on storage cassettes 54A, 54B and 54C such that their short dimension "x" is facing atmospheric robot 50. That is, robot blade 56 during loading of the substrates into chambers 20 and 22, for example, accesses the substrates by moving beneath them in a direction substantially normal to the short dimension "x". The substrates are thus loaded into the load lock chambers along a direction generally perpendicular to their short dimension. Similarly, the substrates are unloaded from chambers 20 and 22 by robot 50 in a direction generally perpendicular to their short dimension. That is, robot blade 56 moves beneath the substrates in chambers 20 and 22 in a direction substantially normal to the short dimension "x" for unloading. However, as will be described in more detail below, at the vacuum side of chambers 20 and 22, a substrate is inserted into and removed from chambers 20 and 22, and process chamber 12, 14 and 16 across the long dimension "y".

If the substrates are square, the dimensions "x" and "y" are obviously equal. Therefore, for example, the robot blade 56 of the atmospheric robot 50 would move beneath a square substrate in chambers 20 and 22 in a direction substantially normal to, for example, the "x" dimension for unloading. However, at the vacuum side of chambers 20 and 22, the square substrate is inserted into and removed from chambers 20 and 22, and process chambers 12, 14 and 16 across the "y" dimension. As such, a square substrate is loaded into or removed from the load lock chambers on the atmospheric side in a direction generally perpendicular to one dimension, while at the vacuum side of the load lock chambers, the square substrate is inserted into and removed from chambers 20 and 22, and process chambers 12, 14 and 16, across a second dimension, for example, the "y" dimension which is perpendicular to the "x" dimension.

As shown in FIG. 1, system 10 further includes a robot 60 centrally positioned within central vacuum chamber 18. Vacuum robot 60 is a dual arm robot. As such, it includes an associated blade or arm assembly 62 that comprises two individual arms. Each robot arm is arranged for independent motion relative to a central hub. The robot arms can be rotated in the same direction or opposite directions. The robot arms can be reversibly extended and retracted (R movement) independently of each other. The robot 60 can transfer substrates between chambers 20 and 22 and the individual process chambers 12, 14 and 16, and, if necessary, from one process chamber to another.

As shown in FIG. 2, the robot's R movement (straight line extension and retraction) is indicated by arrow 60a, while its pivotal θ movement is along arrow 60b. The dual blade or end effector arrangement allows robot 60 to remove a substrate from a process chamber while presenting a substrate to be processed to the process chamber. Similarly, a processed substrate may be presented to one of the load lock chambers after a substrate to be processed is removed from that load lock chamber.

The robot blade assembly 62 accesses or engages, for loading or unloading, the substrates in chambers 20 and 22 across their long dimension "y". That is, a robot blade of blade assembly 62 moves beneath a substrate in a direction substantially normal to the long dimension "y" of the substrate. The substrates are thus inserted into or extracted from the vacuum side of the load lock chambers along a direction that is generally perpendicular to the long dimension of the substrates. Similarly, the substrates are positioned in and removed from the individual process chambers 12, 14 and 16 across their long dimension "y". That is, the substrates are loaded into and unloaded from the process chambers in a direction generally perpendicular to long dimension "y". The robot has two positions in "z", so that both arms may extend and retract in the same plane.

Figure 4:
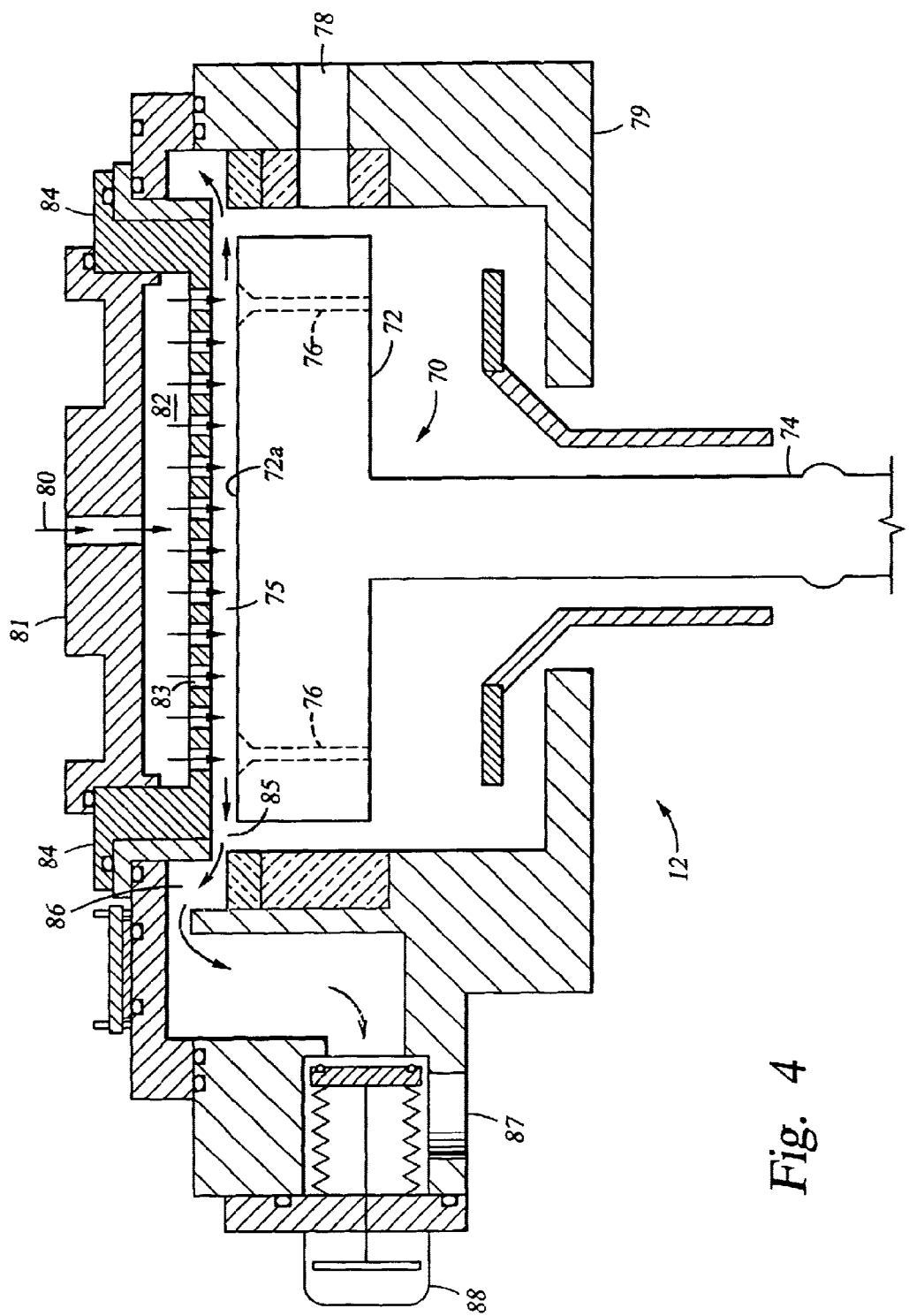
FIG. 4 is a schematic cross-sectional view of a PECVD processing chamber.

By way of example, and as shown in FIG. 4, a process chamber 12 may be a PECVD processing chamber that includes a susceptor 70 having a substrate support plate 72 mounted on a stem 74. The susceptor is centered within the process chamber. A substrate is supported on support plate 72 in a substrate processing or reaction region 75. A lift mechanism (not shown) is provided to raise and lower the susceptor. Lift pins (not shown) may pass through lift pin holes 76 in the support plate to facilitate the transfer of substrates into and out of the process chamber through an opening 78 in a sidewall 79 of chamber 12, and corresponding opening in sidewall 19, by robot blade assembly 62. The opening 78 is closable by slit valve 12a (see FIG. 1).

The support plate 72 is rectangular in shape, and has an appropriate width and length to accommodate the substrate to be processed. A number of heating elements (not shown) may be located beneath the upper surface 72a of support plate 72 to uniformly heat the substrate during processing.

As mentioned, robot blade assembly 62 facilitates the transfer of substrates into and out of process chamber 12 in a direction substantially perpendicular to the long dimension "y" (FIG. 2) through an opening 78 in sidewall 79 of chamber 12. Once the robot blade moves a substrate into position, the lift pins move upwardly to support the substrate prior to its being lowered into a processing position. In particular, the lift pins move through lift pin holes 76 to contact and support the substrate. The lift pins may move through lift pin holes 162 by the action of a lift means (not shown) such as known translation mechanisms or linear feedthroughs. Upon being contacted and supported by the lift pins, the substrate may be lowered into position for processing.

After the substrate is positioned on susceptor 72, the opening 78 is closed by slit valve 12a, and the deposition process may begin. After the deposition process is complete, slit valve 12a is opened, and the substrates is removed by robot 60. Specifically, the lift pins move upwardly through lift pin holes 76 to support the substrate above the surface of the susceptor so the substrate may be engaged by robot blade assembly 62 to be withdrawn for the process chamber via opening 78.

The other process chambers 14 and 16 may operate and be constructed in the same way.

Initially, chamber 20 is at atmospheric pressure, while central chamber 18 may be at its vacuum operating pressure of, for example, about 1 Torr. Thus, door 21b is closed to isolate chamber 18 from chamber 20 and the atmosphere. Door 21, however, is open so that the substrates to be processed may be loaded into chamber 20.

Specifically, the external robot 50 accesses the substrates to be processed from one or more of storage cassettes 54A, 54B and 54C. In the embodiment illustrated, a substrate is loaded onto one of each of the three shelves 38 of cassette 30 in heating section 32 of load lock chamber 20 (see FIG. 3). The external robot makes the necessary R, θ and Z movements to access the substrates on the storage cassettes and then insert them onto each shelf of cassette heating section 32. The elevator assembly 35 incrementally raises the cassette by the height of one shelf so that an empty shelf is opposite door 21. A substrate is placed on that shelf and so fourth until all of the shelves of the cassette are filled.

As noted, the substrates are loaded into the cassette across their short dimension. That is, the robot blade assembly 56 engages a substrate in a storage cassette in a direction substantially perpendicular to the short dimension of the substrate. After all the substrates, three in the embodiment illustrated, have been loaded into the load lock chamber 20, slit valve 21 is closed to isolate the load lock chamber 20 from ambient atmosphere 28. The load lock chamber 20 is then evacuated to an operating pressure which corresponds to the pressure within central chamber 18, which may be about 1 Torr.

For purposes of illustration, it is assumed that system 10 includes only three process chambers and that three substrates are processed at a time. However, the system may be modified to include more or less than three process chambers.

During the time the substrates are being loaded into cassette heating section 32 of chamber 20, at ambient atmospheric conditions, they are being preheated to a processing temperature, for example, of between 300 and 450° C. In the initial start-up of the system, the cassettes in each of load lock chambers 20 and 22 may be empty; that is, they do not contain any substrates. The substrates initially loaded in the cassette heating section of chamber 20, for example, need to be heated for an adequate period of time to reach the desired processing temperature. These substrates may be heated for the time periods shown in FIG. 5A, which are discussed in more detail below. The substrates processed in system 10 after system start-up are also processed in accordance with the preheating cycle of FIG. 5A.

As shown by FIG. 5A, the first substrate is loaded onto a shelf 38 of cassette heating section 32 and heated for a time $t_1$. The second substrate is then loaded into the cassette heating section and heated for a time $t_2$, which is less than the time $t_1$. The time interval between loading the first substrate and the second substrate is the time $t_4$. The last substrate is then loaded into the cassette heating section and heated for the time $t_3$. The time $t_3$ is less than the time $t_2$, which, as noted, is less than $t_1$. The time $t_5$ is the time interval between loading the first substrate and the last substrate into the cassette. The time $t_l$ is the time it takes to load three substrates to be processed into a load lock chamber and to remove three processed substrates from the load lock chamber.

The time it takes to load the substrates into a load lock chamber during start-up of system 10 is considerably less than the time $t_1$. Nonetheless, as mentioned, the substrates during system start-up may be preheated in accordance with the heating cycle of FIG. 5A. By way of example, in the embodiment illustrated, $t_1$ equals 120 seconds, $t_2$ equals 104 seconds, $t_3$ equals 88 seconds, $t_4$ equals 16 seconds, and $t_5$ equals 32 seconds.

During the evacuation or pump down of chamber 20 to the vacuum operating pressure of chamber 18, the substrates are still being heated over the time period $t_e$. This time period may equal to 60 seconds. The time $t_6$ represents the time it takes to transfer the first substrate from chamber 20 to a position, for example, adjacent the slit door of process chamber 12. The time $t_7$ represents the time it takes to lower this substrate onto the susceptor in chamber 12. The times $t_{w1}$ and $t_{w2}$ represent the time in which the second and third substrates, respectively, are waiting to be transferred to one of the other two process chambers. By way of example, the time $t_6$ and $t_7$ may each be equal to 10 seconds, while the times $t_{w1}$ and $t_{w2}$ may be equal to 30 and 50 seconds, respectively.

The total preheat time for the first substrate is equal to $t_1 + t_e$, while the total preheat time for the second substrate is equal to $t_2 + t_e + t_{w1}$. The total preheat time for the third substrate is then equal to $t_3 + t_e + t_{w2}$. In the example given, the total preheat times for the first, second and third substrates are 180, 194 and 198 seconds, respectively.

During time the period chamber 20 is being evacuated, robot 50 can initiate the loading of substrates into chamber 22. As described above with respect to the loading of chamber 20, the substrates are loaded onto each of the three shelves of the cassette heating section of chamber 22. The substrates are loaded into chamber 22 through door 25.

After chamber 20 has been evacuated so that its interior pressure equals the pressure within transfer chamber 18, slit valve 22 is opened so that robot 60, using its R and θ movements, may access the substrates in the cassette heating section for transfer to the individual process chambers 12, 14 and 16. The elevator assembly 35 appropriately increments the cassette in chamber 20 by the height of one shelf so that each substrate in chamber 20 can be sequentially positioned opposite door 22 for engagement by robot blade assembly 62 of robot 60. Specifically, a selected one of the arms or end effectors of blade assembly 62 as is used to remove the substrates from chamber 20.

As noted, the substrates are removed from chamber 20 across their long dimension. That is, a substrate is removed from chamber 20 by robot 60 along a direction substantially perpendicular to the substrate's long dimension "y". The substrates are likewise inserted into the individual process chambers 12, 14 and 16 across their long dimension, as shown by FIG. 2.

The robot 60 takes one substrate at a time from the load lock chamber 20 and loads one substrate into each of the individual process chambers 12, 14 and 16. As noted above with reference to FIG. 5A, the time it takes to transfer a substrate from chamber 20 and position it on a susceptor in one of the individual process chambers is the time $t_6 + t_7$. The deposition process in the process chamber is initiated as soon as the substrate to be processed is suitably positioned on the susceptor and the process chamber slit valve is closed. After the last substrate has been removed from load lock chamber 20 and inserted, for example, into process chamber 16, door 21b is closed, and load lock chamber 20 is vented to atmospheric conditions. Three more substrates may then be loaded into the cassette heating section of chamber 20.

FIG. 5B is an exemplary illustration of the process time $t_p$ for a substrate in each of the three process chambers. The process time $t_p$ may be divided into five segments. Two of the segments are the vacuum exchange times wherein the substrate is transferred between a load lock chamber, for example, chamber 20, and a selected process chamber, for example, process chamber 12. The vacuum exchange time may be equal to $t_{10}$ (see also FIG. 6B, for example, discussed below). The process time further includes the time $t_H$ during which a substrate in a process chamber is heated to the process temperature before the introduction of the deposition process gases. The deposition process gases flow in the process chamber for the time period $t_D$. After the deposition process has been completed, as discussed above, the substrate is lifted from the susceptor in the process chamber by means of lift pins. The time for this operation is the time $t_L$.

By way of example, the heating and deposition times $t_H$ and $t_D$ may equal 60 and 70 seconds, respectively. The lift time $t_L$ and the vacuum exchange time may equal 20 and 30 seconds, respectively. The process time $t_p$ will then equal 180 seconds.

As noted, after the third substrate in load lock chamber 20 has been loaded into process chamber 16, door 21b is closed and the load lock chamber 20 is vented to the atmosphere for loading of additional substrates to be processed into chamber 20. While this is happening, the other load lock chamber 22 is being pumped down to the vacuum operating pressure within central chamber 18. As in the case of the substrates initially loaded into chamber 20, the substrates are preheated in the cassette heating section of the load lock chamber 22 in accordance with the heating cycle shown in FIG. 5A.

After chamber 22 reaches the operating vacuum pressure within central transfer the load lock chamber 18, slit valve 26 is opened for the transfer of the preheated substrates to be processed from the load lock chamber 22 to the individual processing chambers 12, 14 and 16. As noted, the substrates are removed from the load lock chamber 22 and inserted into the process chambers in a direction substantially perpendicular to the long dimension of the substrate.

The internal robot 60 engages a selected one of the substrates in the load lock chamber 22, using its R and θ movements. The selected substrate is supported on a first arm of robot 62. The door 12a of the process chamber 12 is opened, and the empty or second arm of robot is extended to engage the processed or finished substrate in chamber 12 to remove it from the chamber. The 60 robot then extends the substrate to be processed, which is supported on the first arm of robot blade assembly 62, into the process chamber 12. The robot then rotates to the load lock chamber 22, and the finished substrate from the process chamber 12, located on the second arm of robot assembly 62, is then loaded into cassette cooling section 32 of the load lock chamber 22 by robot 60. The first arm of the robot blade assembly 62 then engages the next substrate to be processed in the load lock chamber 22 and rotates to a position to insert that substrate into process chamber 14. The processed substrate in chamber 14, however, is first removed, by means of the second arm of the robot blade assembly, before the substrate to be processed is inserted into the process chamber 14. Thereafter, the second arm of the robot blade assembly rotates to a position with respect to the load lock chamber 22 to insert the finished substrate from process chamber 14 into the cassette cooling section of chamber 22.

At this point, the next substrate to be processed in chamber 22 is removed by the appropriate arm of the robot blade assembly, and that arm is rotated and extended to a position to insert that substrate into process chamber 16. As previously described, the finished substrate in process chamber 16 is first removed by the robot before the substrate to be processed is inserted into the process chamber. The finished substrate from process chamber 16 is then inserted into the cassette cooling section of chamber 22.

As described, the processed substrates are inserted into the cassette cooling section while the substrates to be processed are removed from the cassette heating section. The elevator assembly associated with chamber 22 is thus operated so that the appropriate shelf, in either the cassette heating or cooling section, is located opposite door 26 for access by the appropriate arm of robot blade assembly 62. Also, the cooling process is initiated as soon as the first processed substrate is inserted into the cassette cooling section. As at that time, coolant is flowing through coolant passageways 46. Gases from the process chambers will also contribute to the cooling of the substrates when the process chamber doors and the load lock doors on the vacuum side are open.

After the last finished substrate has been loaded into the cassette cooling section of the load lock chamber 22, door 26 is closed, and the load lock chamber 22 is vented to ambient atmospheric conditions. Thereafter, the external door 25 of the load lock chamber 22 is opened so that external robot 50 may access the finished substrates in the cassette cooling section of the load lock chamber 22, the external robot 50 is operated to load additional substrates to be processed into the cassette heating section of the load lock chamber 22.

This provides additional time in which the processed substrates may be cooled to the ambient temperature.

An appropriately-programmed microprocessor-based controller controls the overall operation and the various components of system 10 described above. The controller also directs robot 50 to remove the substrates from the cassette cooling section of chamber 22 one at a time and to reinsert them onto the particular storage cassette, either storage cassette 54a, 54b or 54c, on which they were originally located prior to being loaded into chamber 20.

While the finished substrates are being loaded into the second load lock chamber 22 and the substrates to be processed in the second load lock chamber 22 are being loaded unto the various process chambers, the first load lock chamber 20 is vented to ambient atmospheric conditions for the loading of additional substrates to be processed into the cassette heating section of the load lock chamber 20. Again, the new substrates in the first load lock chamber 20 are preheated in accordance with the substrate heating cycle shown in FIG. 5A. After all these substrates have been loaded into the cassette heating section of the first load lock chamber 20, chamber 20 is evacuated to the vacuum operating pressure within transfer chamber 18. The new substrates in chamber 20 are then, as described above, exchanged one at a time for the finished substrates in process chambers 12, 14 and 16. The finished substrates in the process chambers at this stage were loaded into transfer chamber 18 from the second load lock chamber 22. However, as described, they are removed from the transfer chamber 18 via the first load lock chamber 20, where they are accessed by the external robot 50 to be reinserted onto the storage cassettes from which they originated.

Specifically, the external robot 60 engages a substrate to be processed in the cassette heating section of the load lock chamber 20 to move it to a position to be inserted into process chamber 12. First, however, the finished substrate is removed from process chamber 12. The new substrate to be processed is then inserted into process chamber 12. The finished substrate is then moved by means of the external robot 60 into the cassette cooling section of the first load lock chamber 20. The next substrate to be processed is then removed by the external robot 60 from the cassette heating section of the first load lock chamber 20, and it is inserted into process chamber 14, after the finished substrate in that chamber has been removed. That finished substrate is then inserted into the cassette cooling section of the first load lock chamber 20, and a new substrate to be processed is removed from the cassette heating section of the first load lock chamber 20 to be inserted into process chamber 16. Again, the finished substrate is first removed from process chamber 16 before the new substrate is inserted. The finished substrate from process chamber 16 is then inserted into the cassette cooling section of the first load lock chamber 20. The internal door 22 of the first load lock chamber 20 is closed, and the first load lock chamber 20 is vented to ambient atmospheric conditions. Thereafter, door 21 of chamber 20 is opened, and the internal robot 50 accesses the substrates in the cassette cooling section of the first load lock chamber 20. These cassettes are then returned to the storage cassettes 54a, 54b or 54c from which they were originally loaded into the second load lock chamber 22.

Figure 6A:
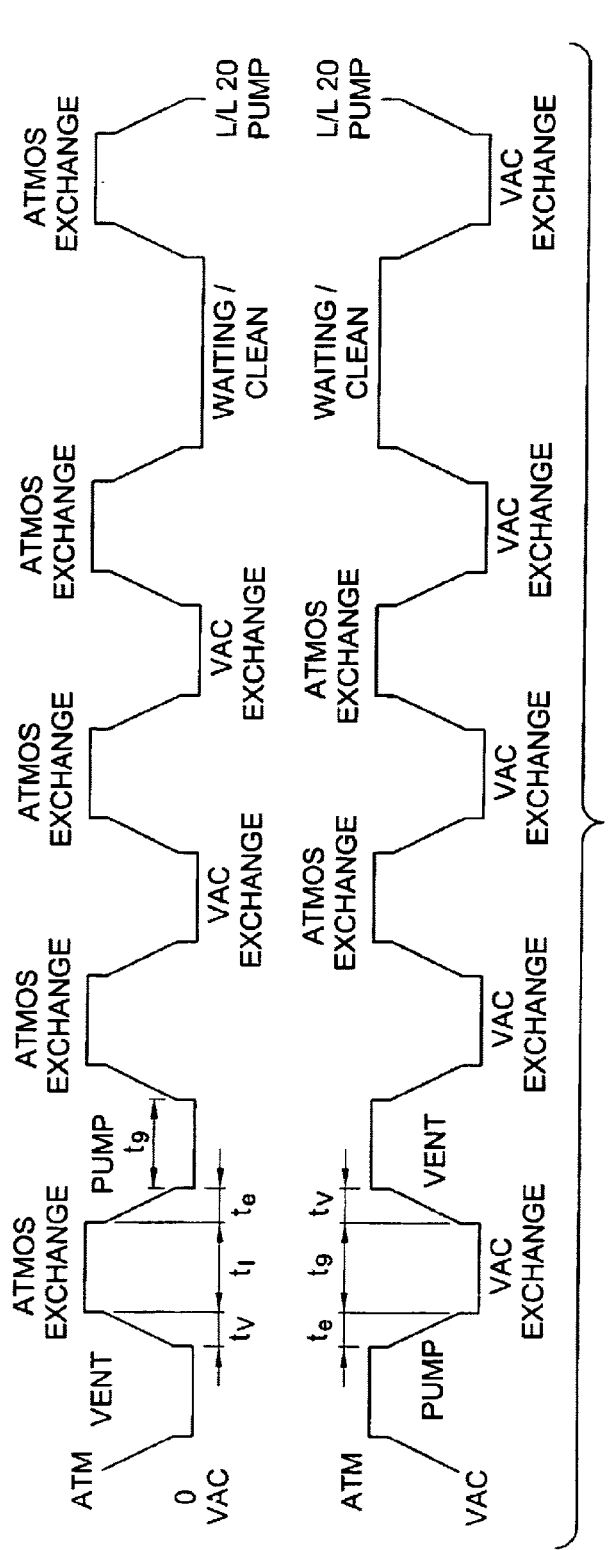
FIG. 6A is a timing analysis illustrating the heating and cooling cycles of the load lock chambers.

The load lock heating and cooling cycles described above for load lock chambers 20 and 22 are shown in FIG. 6A. As shown, when the first load lock chamber 20 is being pumped down or evacuated to the vacuum operating pressure within central transfer chamber 18 for the exchange of substrates between chamber 20 and the process chambers, the second load lock chamber 22 is being vented to ambient atmospheric conditions for unloading of finished substrates. The atmospheric heating time $t_1$ on FIG. 6A is also shown on FIG. 5A. Similarly, the time it takes to pump a load lock chamber down to the vacuum operating pressure of chamber 18, time $t_e$, is shown on FIG. 6A, and corresponds to the time $t_e$ shown on FIG. 5A. The time it takes to vent a load lock chamber to atmospheric conditions is represented by the time $t_V$. In the embodiment illustrated, $t_V$ may equal $t_E$ and these time periods may be about 60 seconds each.

Figure 6B:
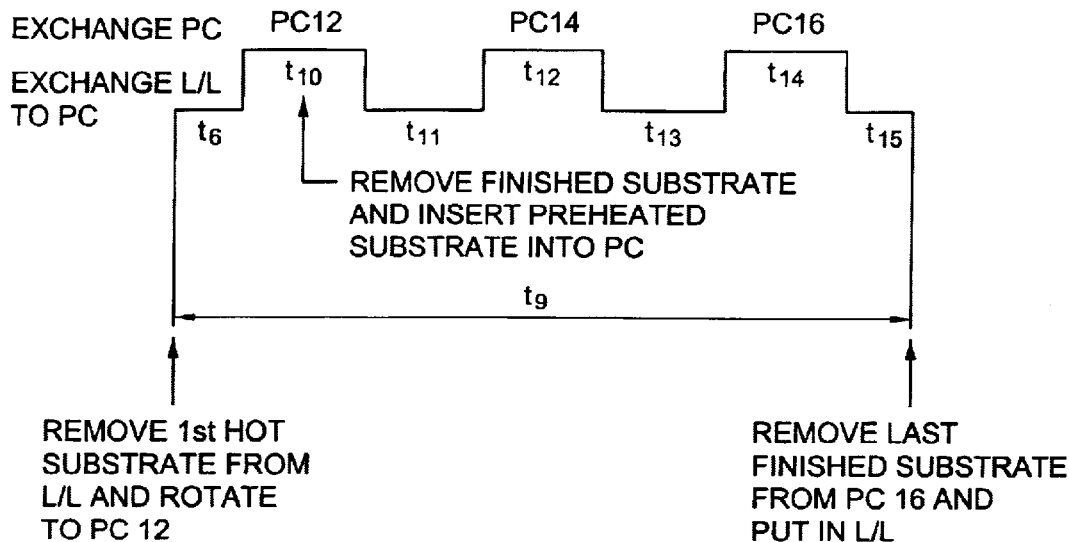
FIG. 6B is a timing analysis illustrating the load lock cycle from the vacuum side of a load lock chamber.
Figure 6C:
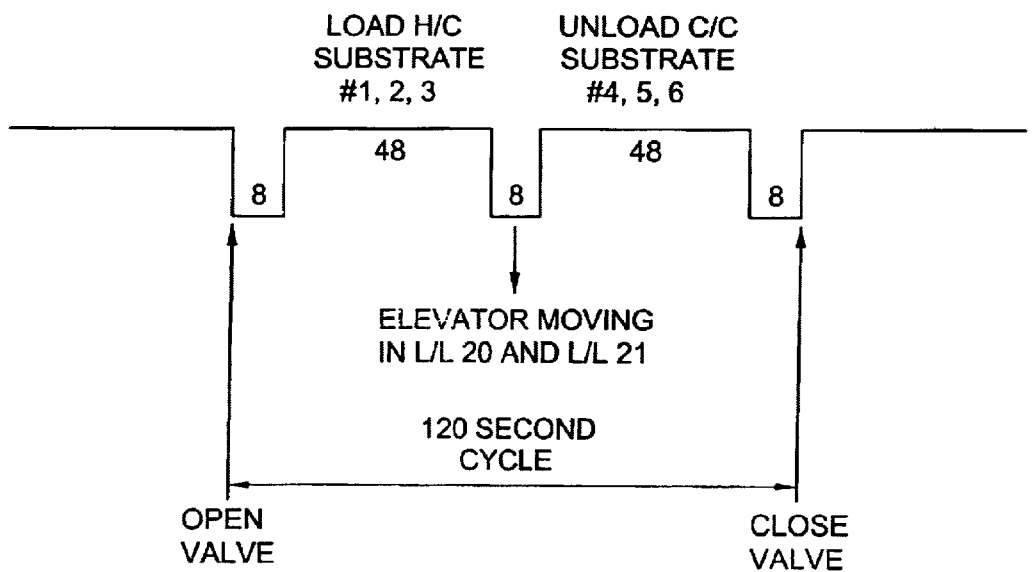
FIG. 6C is a timing analysis illustrating a valve opening and closing sequence.

The time $t_9$ shown on FIG. 6A, is the time it takes to exchange the preheated substrates in a load lock chamber for the finished substrates in the process chambers. As shown in FIG. 6B, the time $t_9$ may be divided into several segments. The time $t_6$ (see also FIG. 5A) is the time it takes to transfer a substrate from, for example, the first load lock chamber 20 to a position adjacent the slit door of process chamber 12. The time $t_{15}$, which can be equal to $t_6$ is the time it takes to transfer the last finished substrate from process chamber 16 to a load lock chamber. The times $t_{10}$, $t_{12}$ and $t_{14}$ represent the time it takes to remove a finished substrate from a respective one of the process chambers and to insert a preheated substrate in its place. The times $t_{11}$ and $t_{13}$ represent the times it takes to insert a finished substrate into a load lock and to remove a substrate to be processed from the load lock. The times $t_{10}$ through $t_{14}$, in the embodiment illustrated, may equal 20 seconds, and the times $t_6$ and $t_{15}$ may each equal 10 seconds. Thus, the time $t_9$ may equal 120 seconds.

The times $t_{10}$ through $t_{14}$ are also shown in FIG. 5B, which, as noted, is a timing analysis of the process chamber cycle. As noted, after a substrate is suitably positioned on a susceptor within a process chamber and the process chamber slit valve is closed, the substrate is heated ($t_H$) and the deposition process ($t_D$) is initiated.

Figure 7:
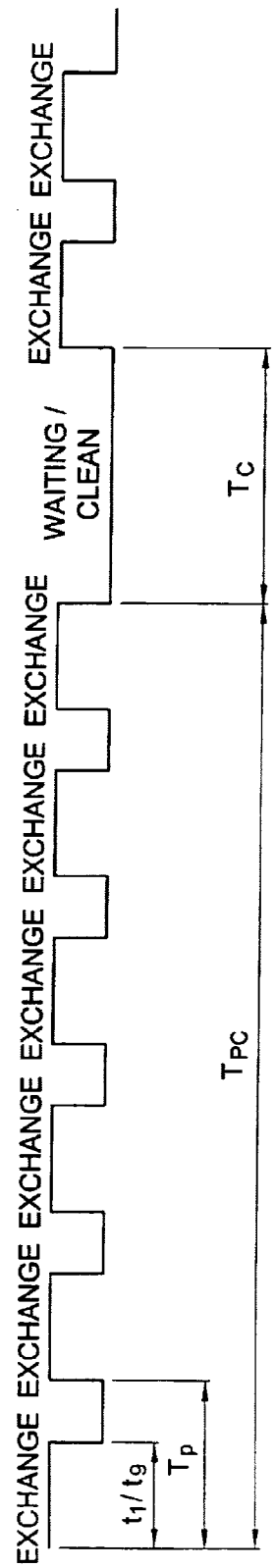
FIG. 7 is a timing analysis illustrating the overall system process and clean cycles.

The timing analysis for the overall system process and clean cycle is illustrated by FIG. 7. As shown, in the embodiment described above, typically six deposition cycles may take place within the process time cycle $T_{PC}$. Each deposition cycle comprises a chamber process time $T_P$ (FIG. 5B), and the exchange times $t_1$ (FIG. 5A) and $t_9$ (FIG. 6B) at the atmospheric and vacuum side, respectively, of the load lock chambers. The time in which the process chambers are cleaned is the time $T_C$. The duration of the clean period may be about 360 seconds. In the embodiment illustrated, $T_{PC}$ may equal to 1,080 seconds. For this process cycle ($T_{PC}$+ $T_C$), 18 substrates may be processed every 1,440 seconds. As such, 45 substrates may be processed every 3,600 seconds.

More than one coating or film can be deposited in a process chamber. This may be accomplished by feeding a first set of precursor gases to the process chamber until the desired film thickness is reached, purging the process chamber, and then feeding a second set of precursor gases to the process chamber. Alternatively, the substrates can be transferred from one process chamber to another, in any preselected order, for the deposition of a different thin film in each chamber. The timing and transfer of the substrates among the various chambers of system 10 is preselected under control, as noted, of the controller.

As discussed, the substrates may be preheated during the time in which they are being loaded into a load lock chamber. Alternatively, the preheating step may take place only after all the substrates have been loaded into a load lock chamber, the load lock door closed, and the load lock chamber evacuated. In either case, as noted, an inert gas, such as $N_2$, may be introduced into the load lock chamber during heating of the substrates. If the load lock door is open for substrate loading, a positive pressure of inert gas may be maintained inside the load lock and/or at the door to prevent air from entering the load lock.

The system 10 provides continuous and rapid processing of substrates by performing preheating and cooling steps in a single batch-type chamber. Substrates may be processed in a process chamber one at a time. The overall size of the system is smaller than heretofore possible, which further adds to the efficiency of its operation.

Although the system of the present invention has been illustrated and described using certain embodiments and sequences, various changes can be made to the system without departing from the essence of the invention. For example, various numbers of process chambers can be employed providing they are accessible to the central transfer chamber, and various sequences of heating, deposition and cooling can be carried out depending upon the thin films and deposition sequence desired. Additional types of processing chambers can be added or substituted in the system, such as gas chemistry etching, physical sputtering, rapid annealing, and precleaning chambers.

Such variations and changes will be apparent to one skilled in the art, and the invention is only meant to be limited by the appended claims.

What is claimed is:

1. An evacuable chamber of a vacuum processing system capable of simultaneously heating and cooling different substrates and including a first vacuum sealable passage on a first side of said chamber and a second vacuum sealable passage on a second side of said chamber for passing said substrates through said passages, comprising:
   a first section in said chamber having first sidewalls including heating means incorporated therein capable of increasing a temperature of any of one or more first substrates disposed in said first section;
   a second section in said chamber having second sidewalls including cooling means incorporated therein capable of decreasing a temperature of any of one or more second substrates disposed in said second section, wherein said first section lacks cooling means corresponding to those provided in said second section and said second section lacks heating means corresponding to those provided in said first section;
   a plurality of shelves in said first section to support respective ones of said first substrates thereon;
   a plurality of shelves in said second section to support respective ones of said second substrates thereon; and
   means including a wall between said first and second sections for thermally isolating said first section from said second section.

2. The evacuable chamber of claim 1, wherein each of said first and second sections includes a plurality of platforms for respectively supporting a plurality of first and second substrates.

3. An evacuable chamber of a vacuum processing system capable of simultaneously heating and cooling different substrates and including a first vacuum sealable passage on a first side of said chamber and a second vacuum sealable passage on a second side of said chamber for passing said substrates through said passages, comprising:
   a first section in said chamber having first sidewalls with resistive heaters incorporated therein capable of increasing a temperature of any of one or more first substrates disposed in said first section, wherein said first sidewalls include no liquid cooling channels;
   a second section in said chamber having seconds sidewalls with liquid cooling channels incorporated therein capable of decreasing a temperature of any of one or more second substrates disposed in said second section, wherein said second sidewalls include no resistive heaters;
   a plurality of shelves in said first section to support respective ones of said first substrates thereon;
   a plurality of shelves in said second section to support respective ones of said second substrates thereon; and
   a barrier, including a wall disposed between said first and second sections, to thermally isolate said first and second sections from each other.

4. The evacuable chamber of claim 3, wherein each of said first and second sections include respective pluralities of shelves for supporting respective pluralities of said first and second substrates thereon.

5. The evacuable chamber of claim 3, wherein said first and second sections are fixed together.

6. The evacuable chamber of claim 3, wherein said first and second sections are capable of simultaneously increasing a temperature of said first substrate and decreasing a temperature of said second substrate.

7. The evacuable chamber of claim 1, wherein said first and second sections are capable of simultaneously increasing a temperature of said first substrate and decreasing a temperature of said second substrate.

8. The evacuable chamber of claim 7, further comprising first and second lifting assemblies operable independently of each other.

9. The evacuable chamber of claim 7, further comprising first and second lifting assemblies operable together.

10. The evacuable chamber of claim 7, wherein said heating means includes resistive heating coils in said first sidewalls.

11. The evacuable chamber of claim 10, wherein said cooling means includes cooling passageways formed in said second sidewalls.

12. A cassette adapted to be positioned in an evacuable load lock chamber capable of simultaneously heating and cooling different substrates and including a first vacuum sealable passage on a first side of said chamber and a second vacuum sealable passage on a second side of said chamber for passing said substrates through said passages to and from said cassette, said cassette comprising;
   a first section capable of heating a substrate supported therein;
   a second section capable of cooling a substrate supported therein;
   a barrier located between said first and said second sections to thermally isolate said first and second sections from each other;
   heaters incorporated into interior sidewalls of the cassette in said first section to increase the temperature of the interior sidewalls of said first section;
   cooling passageway configured to include a coolant and incorporated into interior sidewalls of the cassette in said second section to decrease the temperature of the interior sidewalls of said second section;
   a first plurality of thermally conductive first shelves contacting said sidewalls of said first section so that heat is conducted to said first shelves; and a second plurality of thermally conductive second shelves contacting said sidewalls of said second section so that heat is conducted from said second shelves;

wherein said interior sidewalls of said cassette in said first section include no cooling passageways as provided in said second section and said interior sidewalls of said cassette in said second section include no heaters as provided in said first section.

13. The cassette of claim 12, further comprising supports on said first and second shelves to support said substrates and provide a space between said substrates and said first and second shelves.

14. The cassette of claim 12, wherein said heaters include resistive heating coils.

15. The cassette of claim 12, wherein said barrier includes channels for the circulation of coolant therethrough.

16. The cassette of claim 12, wherein said cassette is mounted on an elevator assembly so that said substrates on said conductive shelves can be sequentially accessed via a slit valve in said load lock chamber.

* * * * *